(12) United States Patent
Kusuda et al.

(10) Patent No.: US 8,212,791 B2
(45) Date of Patent: Jul. 3, 2012

(54) PROTECTION PANEL WITH TOUCH INPUT FUNCTION FOR DISPLAY WINDOW OF ELECTRONIC DEVICE, AND ELECTRONIC DEVICE

(75) Inventors: Yasuji Kusuda, Kyoto (JP); Takeshi Asakura, Kyoto (JP); Koji Okamoto, Kyoto (JP); Toshiyuki Iwai, Kyoto (JP)

(73) Assignee: Nissha Printing Co., Ltd., Kyoto (JP)

( * ) Notice: Subject to any disclaimer, the term of this patent is extended or adjusted under 35 U.S.C. 154(b) by 295 days.

(21) Appl. No.: 12/739,813

(22) PCT Filed: Oct. 29, 2008

(86) PCT No.: PCT/JP2008/069628
§ 371 (c)(1),
(2), (4) Date: Apr. 26, 2010

(87) PCT Pub. No.: WO2009/057628
PCT Pub. Date: May 7, 2009

(65) Prior Publication Data
US 2010/0309152 A1 Dec. 9, 2010

(30) Foreign Application Priority Data
Oct. 31, 2007 (JP) .................. 2007-284579

(51) Int. Cl.
G06F 3/041 (2006.01)
G06F 3/045 (2006.01)
G06F 3/042 (2006.01)
G06F 3/043 (2006.01)
G06F 3/044 (2006.01)
G06F 3/046 (2006.01)
G06F 1/16 (2006.01)
G06K 11/06 (2006.01)
G08C 21/00 (2006.01)
H05K 5/00 (2006.01)
H05K 7/00 (2006.01)

(52) U.S. Cl. ........ 345/173; 345/174; 345/175; 345/176; 345/177; 345/178; 178/18.03; 178/18.04; 178/18.05; 178/18.06; 178/18.07; 178/18.08; 178/18.09; 361/679.01; 361/679.02; 361/679.21; 361/679.26; 361/679.3

(58) Field of Classification Search .... 178/18.03–18.09; 345/173–178; 361/679.01, 679.02, 679.21, 361/679.26, 679.3
See application file for complete search history.

(56) References Cited

U.S. PATENT DOCUMENTS
2004/0263481 A1* 12/2004 Nishikawa et al. ........... 345/173
(Continued)

FOREIGN PATENT DOCUMENTS
JP 60-125616 8/1985
(Continued)

OTHER PUBLICATIONS
International Search Report issued Dec. 9, 2008 in International (PCT) Application No. PCT/JP2008/069628.
(Continued)

Primary Examiner — Bipin Shalwala
Assistant Examiner — Hang Lin
(74) Attorney, Agent, or Firm — Wenderoth, Lind & Ponack, LLP

(57) ABSTRACT

There are included a protection panel main body configured by a transparent plate, a lower electrode sheet laminated onto an upper surface of the protection panel main body, an upper electrode sheet bonded to the lower electrode sheet at peripheral edges thereof with a gap being formed between electrodes, a decorative sheet laminated onto an upper surface of the upper electrode sheet, and an FPC that has an end inserted between the lower electrode sheet and the upper electrode sheet and is connected by thermal compression bonding to output ends of an upper circuit and a lower circuit. Further, the protection panel main body is provided with a thermal compression head inserting space at a portion corresponding to a portion bonded with the FPC by thermal compression so that a thermal compression heater is allowed to be brought closer to the lower electrode sheet.

9 Claims, 15 Drawing Sheets

U.S. PATENT DOCUMENTS

2005/0099402 A1    5/2005    Nakanishi et al.
2007/0181456 A1*    8/2007    Kusuda et al. ............... 206/443

FOREIGN PATENT DOCUMENTS

| | | |
|---|---|---|
| JP | 2005-158008 | 6/2005 |
| WO | 2005/064451 | 7/2005 |

OTHER PUBLICATIONS

Patent Cooperation Treaty (PCT) International Preliminary Report on Patentability issued Jun. 10, 2010 in International (PCT) Application No. PCT/JP2008/069628.

* cited by examiner

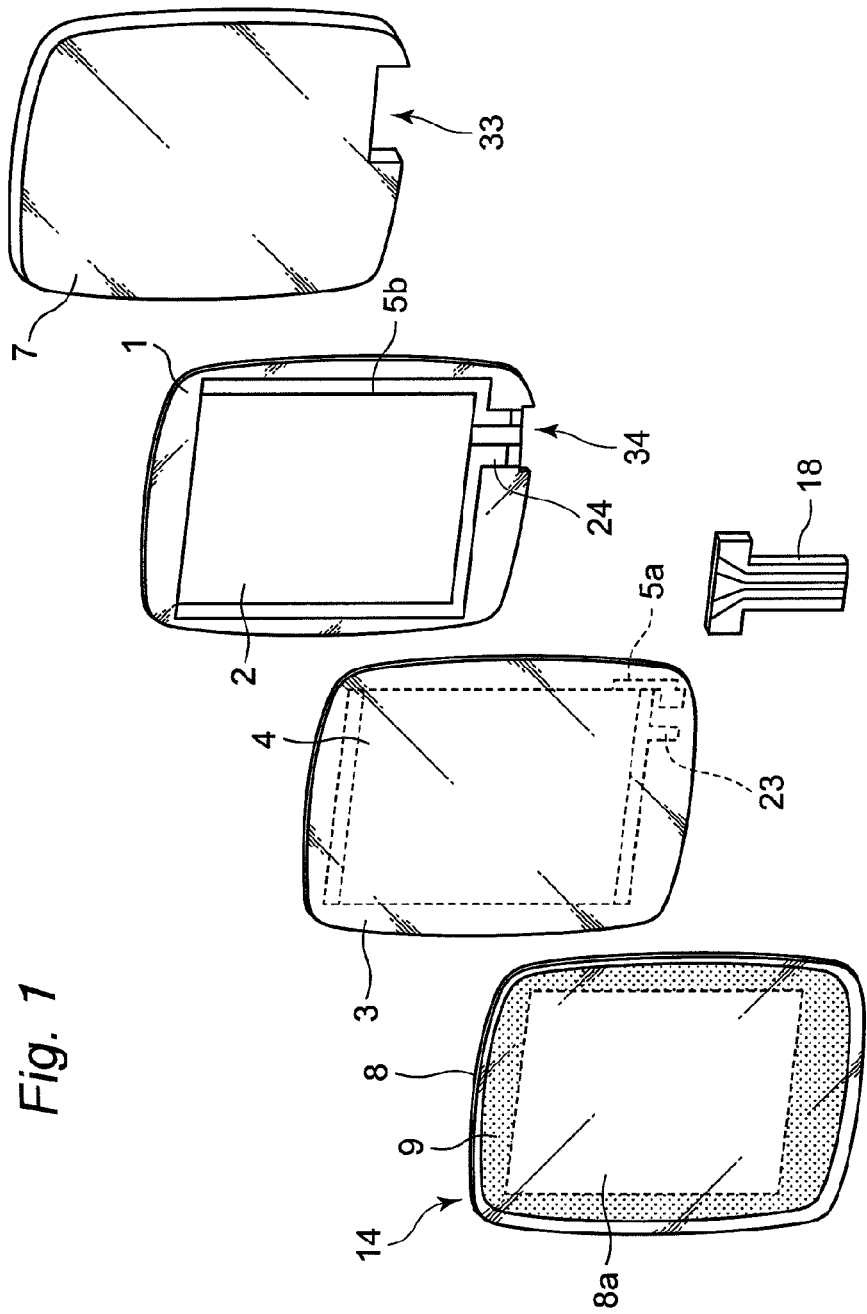

PROTECTION PANEL WITH TOUCH INPUT FUNCTION FOR DISPLAY WINDOW OF ELECTRONIC DEVICE, AND ELECTRONIC DEVICE

TECHNICAL FIELD

The present invention relates to a protection panel with a touch input function for a display window of an electronic device, which is applied to a handheld information terminal such as a PDA (Personal Digital Assistant) or a handy terminal, OA (Office Automation) equipment such as a copier or a facsimile, a smartphone, a mobile phone, a handheld game machine, an electronic dictionary, a vehicle navigation system, a small PC (Personal Computer), various types of home electric appliances, or the like, and which is excellent in surface flatness as well as in reliability at a portion connected with an FPC (Flexible Printed Circuit). The present invention also relates to an electronic device including such a protection panel.

BACKGROUND ART

A general casing for an electronic device such as a mobile phone or a smartphone is formed by combining a front casing and a rear casing that are made of a synthetic resin. There is usually fixed onto the surface of the front casing, by fusion bonding or the like, a protection panel for protecting a liquid crystal display window.

The electronic device such as the mobile phone or the smartphone is sometimes provided with a touch panel mounted on a liquid crystal display screen so as to allow touch input to the liquid crystal display screen. In this case, the liquid crystal display window of the casing is left open as there cannot be provided a protection panel that inhibits input to the touch panel disposed therebelow.

However, recently, Patent Document 1 has newly disclosed the protection panel with a touch input function. Specifically, as shown in FIGS. 7 to 9, a protection panel 100 for a display window of an electronic device includes a protection panel main body 107 configured by a transparent plate, a lower electrode sheet 101 that has a rectangular lower transparent electrode 102 placed on an upper surface of a transparent resin film and a lower circuit 105b provided at a periphery of the lower transparent electrode 102, and is laminated onto an upper surface of the protection panel main body 107, an upper electrode sheet 3 that has a rectangular upper transparent electrode 104 placed on a lower surface of a transparent resin film and an upper circuit 105a provided at a periphery of the upper transparent electrode 104, and is bonded to the lower electrode sheet 101 at peripheral edges thereof with a gap 120 (refer to FIG. 10) being formed between the electrodes 102 and 104, a decorative sheet 108 that has on at least one of surfaces of a transparent resin film a decorative layer 109 defining a transparent window portion 108a so as to hide the lower circuit 105b and the upper circuit 105a, and is laminated onto an upper surface of the upper electrode sheet 103, and an FPC 118 that has an end inserted between the lower electrode sheet 101 and the upper electrode sheet 103 and is connected by thermal compression bonding to output ends 123 and 124 of the upper circuit 105a and the lower circuit 105b respectively (refer to FIG. 7). The protection panel 100 is configured to be fitted and retained with no gap in a panel fitting portion 122 of a casing 113 provided with an opening 113a such that an outer surface of the protection panel 100 forms one plane together with a periphery thereof. The protection panel 100 protects a display device 115 that is disposed therebelow so as to be externally visible via the transparent window portion 108a (refer to FIGS. 8 and 9).

The protection panel 100 for a display window of an electronic device is thus configured to allow touch input to a liquid crystal display screen. Furthermore, there is generated in the protection panel no difference in height among the surface of the transparent window portion 108a, the surface of the decorative layer 109 at the periphery of the transparent window portion 108a, and an outer surface 113b of the casing 113 (refer to FIG. 9). The transparent window portion 108a thus appears integrally with the design of the casing 113.
Patent Document 1: Pamphlet of WO 2005/064451

DISCLOSURE OF INVENTION

Issues to be Solved by the Invention

However, the protection panel 100 described in Patent Document 1 had the following issues.

Specifically, in the protection panel 100, after the protection panel main body 107, the lower electrode sheet 101, the upper electrode sheet 103, and the decorative sheet 108 are laminated all together, the end of the FPC 118, to which a conductive adhesive agent is applied, is inserted between the lower electrode sheet 101 and the upper electrode sheet 103 to be connected by thermal compression bonding to the output ends 123 and 124 of the lower circuit 105b and the upper circuit 105a respectively. In general thermal compression bonding, the FPC 118 is placed on a sliding table with the end thereof being inserted between the lower electrode sheet 101 and the upper electrode sheet 103. After the sliding table is slid to be shifted to a predetermined position, a heater 130 is moved downwards to be pressed (refer to FIG. 10). The heater 130 is provided on a surface thereof with a metal head that is made of brass or the like and is covered with an elastic material such as silicon rubber.

However, in thermal compression bonding, in a case where the heater 130 is pressed to the end of the FPC from the decorative sheet-108-side (refer to FIG. 10), what stands out on the upper surface of the decorative sheet 108 is a thermal compression taint 131 or an unevenness 132 generated due to differences in height of circuits included in the FPC 118. In such a case, the protection panel 100 is deteriorated in surface flatness (refer to FIG. 12).

On the other hand, in a case where the heater 130 is pressed to the end of the FPC from the protection panel main body-107-side (refer to FIG. 11) so as to prevent the above described defect, heat and pressure cannot be sufficiently transmitted to the conductive adhesive agent that is applied to the end of the FPC 118. As a result, the protection panel 100 has malfunction with no electric connection provided.

In view of the above issues, it is an object of the present invention to provide a protection panel that has a touch input function for a display window of an electronic device and an electronic device which are excellent in surface flatness as well as in reliability at a portion connected with an FPC.

Means for Solving the Issues

In order to realize the above objects, the present invention provides the following configurations.

According to a first aspect of the present invention, there is provided a protection panel with a touch input function for a display window of an electronic device, which is configured to be fitted and retained with no gap in a panel fitting portion of a casing provided with an opening such that an outer surface thereof forms one plane together with a periphery, and which protects a display device disposed therebelow so as to be externally visible via a transparent window portion; the protection panel comprising:

- a protection panel main body configured by a transparent plate;
- a lower electrode sheet that has a rectangular lower transparent electrode on an upper surface of a transparent resin film and a lower circuit provided at a periphery of the lower transparent electrode, and that is laminated onto an upper surface of the protection panel main body;
- an upper electrode sheet that has a rectangular upper transparent electrode on a lower surface of a transparent resin film and an upper circuit provided at a periphery of the upper transparent electrode, and that is bonded to the lower electrode sheet at peripheral edges thereof with a gap being formed between the electrodes;
- a decorative sheet that has a decorative layer defining the transparent window portion at least on one surface of a transparent resin film so as to hide the lower circuit and the upper circuit, and that is laminated onto an upper surface of the upper electrode sheet; and
- an FPC that has an end inserted between the lower electrode sheet and the upper electrode sheet, and that is connected by thermal compression bonding to output ends of the upper circuit and the lower circuit, wherein
- the protection panel main body has a thermal compression head inserting space at a portion corresponding to a portion bonded with the FPC by thermal compression, the thermal compression head inserting space reducing a distance between a surface of the protection panel main body and a surface of the lower electrode sheet at the portion corresponding to the portion bonded with the FPC by thermal compression, relative to a distance therebetween at a portion other than the portion corresponding to the portion bonded with the FPC by thermal compression, and
- the lower electrode sheet has an end surface recessed inwards to configure a turning FPC accommodating space that allows the FPC to turn to a rear side.

According to a second aspect of the present invention, there is provided the protection panel with a touch input function for a display window of an electronic device according to the first aspect, wherein
the thermal compression head inserting space is provided as a cutout portion that is formed in the protection panel main body.

According to a third aspect of the present invention, there is provided the protection panel with a touch input function for a display window of an electronic device according to the first aspect, wherein
the thermal compression head inserting space is provided as a concave portion that is formed in the protection panel main body.

According to a fourth aspect of the present invention, there is provided the protection panel with a touch input function for a display window of an electronic device according to any one of the first to third aspects, wherein
the turning FPC accommodating space of the lower electrode sheet is extended on a whole of a side from which the FPC is pulled out.

According to a fifth aspect of the present invention, there is provided the protection panel with a touch input function for a display window of an electronic device according to any one of the first to third aspects, wherein
the thermal compression head inserting space has a resin portion formed by filling synthetic resin therein.

According to a sixth aspect of the present invention, there is provided the protection panel with a touch input function for a display window of an electronic device according to any one of the first to third aspects, wherein
the thermal compression head inserting space has a switch disposed therein.

According to a seventh aspect of the present invention, there is provided the protection panel with a touch input function for a display window of an electronic device according to any one of the first to third aspects, wherein
the protection panel main body is provided on a side surface configuring the thermal compression head inserting space with a casing engaging portion that has an inclined surface inclined inwards from the surface of the protection panel main body towards the lower electrode sheet.

According to an eighth aspect of the present invention, there is provided the protection panel with a touch input function for a display window of an electronic device according to any one of the first to third aspects, wherein
the thermal compression head inserting space is provided as a plurality of pectinate spaces that are formed correspondingly to a plurality of connecting ends of the FPC to be connected to the output ends of the upper circuit and the lower circuit.

According to a ninth aspect of the present invention, there is provided an electronic device comprising the protection panel with a touch input function for a display window of an electronic device of any one of the first to third aspects, the protection panel being fitted and retained with no gap in the panel fitting portion of the opening in the casing such that the outer surface of the protection panel forms one plane together with the periphery.

Effects of the Invention

According to the present invention, the protection panel main body is provided with the thermal compression head inserting space at the portion corresponding to the portion bonded with the FPC by thermal compression so as to reduce the thickness of the lower electrode sheet relative to that of the remaining portion. The heater can thus be pressed directly or closely onto the lower electrode sheet from the protection panel main body side with use of the thermal compression head inserting space. Accordingly, the protection panel with a touch input function according to the present invention is excellent in reliability at the portion connected with the FPC, since both heat and pressure are sufficiently transmitted to the conductive adhesive agent that is applied to the end of the FPC. Further, since the heater is pressed via the protection panel main body in this case, the thermal compression taint or the unevenness generated due to the difference in height of the circuits in the FPC appears on the lower surface of the lower electrode sheet. Therefore, the protection panel with a touch input function according to the present invention is not deteriorated in surface flatness.

BRIEF DESCRIPTION OF DRAWINGS

These and other aspects and features of the present invention will become clear from the following description taken in conjunction with the preferred embodiments thereof with reference to the accompanying drawings, in which:

FIG. 19 is a perspective view of a protection panel according to still further another modification of the first embodiment;

FIG. 20 is a perspective view of a protection panel according to still further another modification of the first embodiment;

FIG. 21 is a perspective view of a protection panel according to still further another modification of the first embodiment;

BEST MODE FOR CARRYING OUT THE INVENTION

Figure 2:
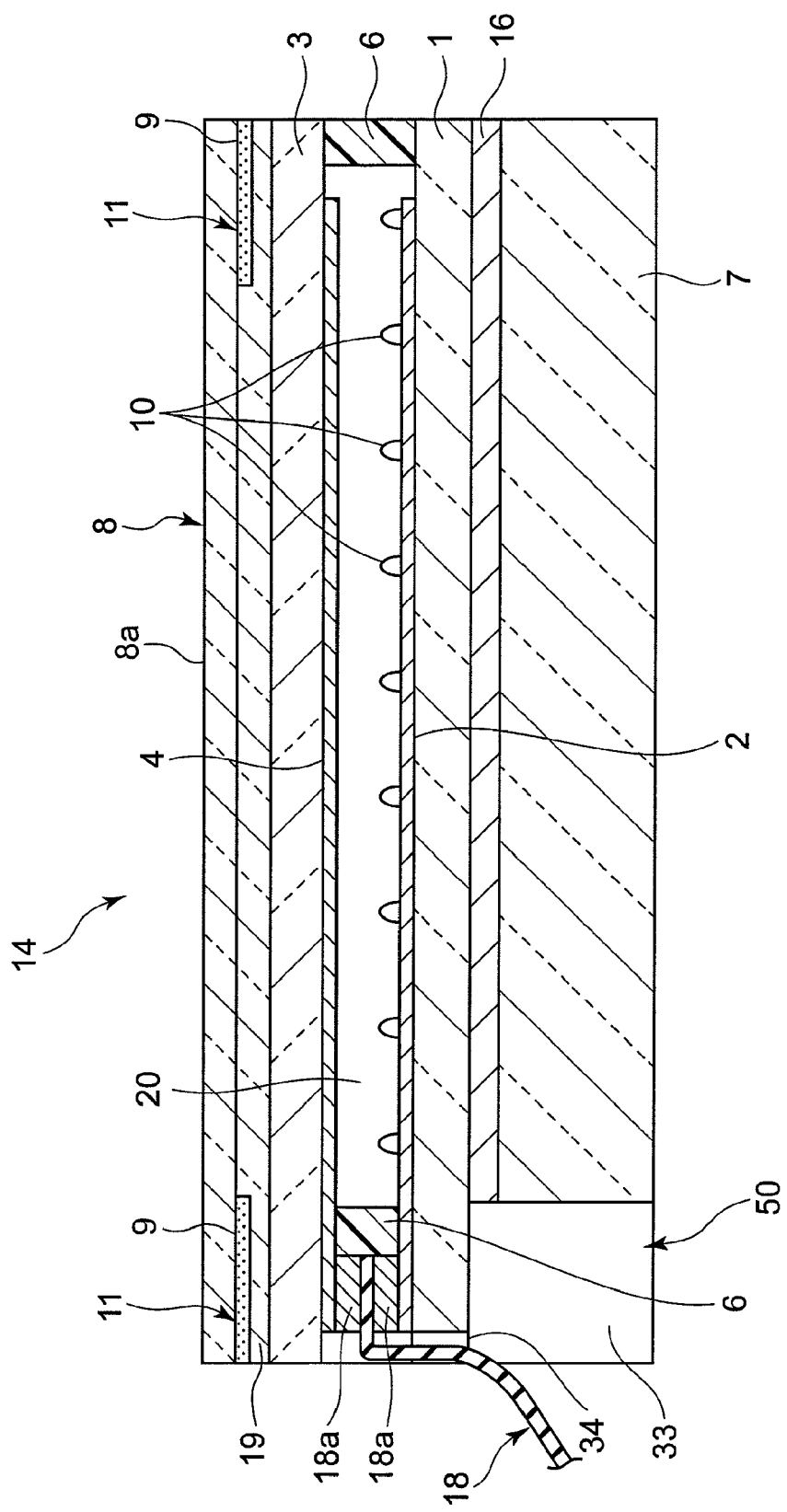
FIG. 2 is a cross sectional view of the protection panel, shown in FIG. 1, according to the first embodiment of the present invention.

Before the description of the present invention proceeds, it is to be noted that like parts are designated by like reference numerals throughout the accompanying drawings.

Figure 1:
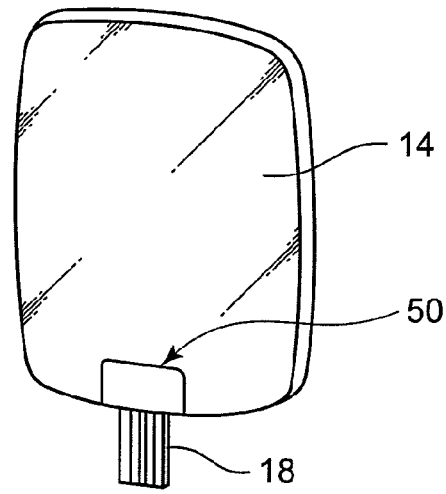
FIG. 1 is an exploded view of a protection panel for a display window of an electronic device according to one example of a first embodiment of the present invention.
Figure 2:
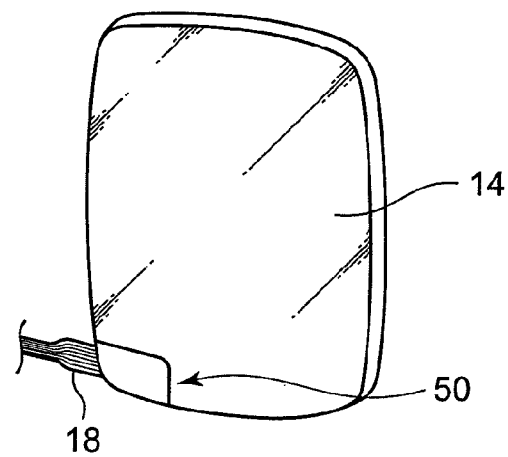
Figure 2:
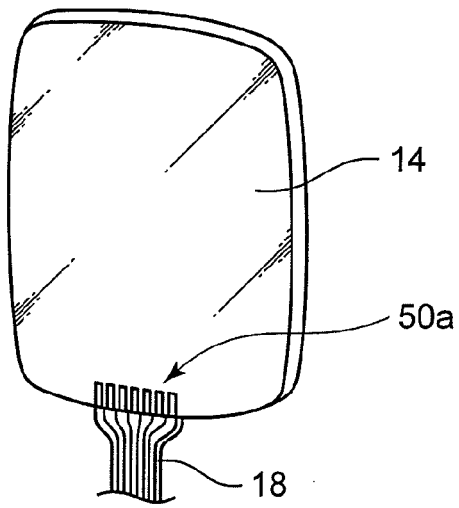

Described in detail below with reference to the drawings is a first embodiment of the present invention. FIG. 1 is an exploded view of a protection panel for a display window of an electronic device according to the first embodiment of the present invention. FIG. 2 is a cross sectional view of the protection panel shown in FIG. 1. The protection panel for a display window of an electronic device according to the first embodiment of the present invention is particularly suitable for a touch panel that has a narrow frame and is used in a handheld terminal such as a mobile phone.

Figure 5:
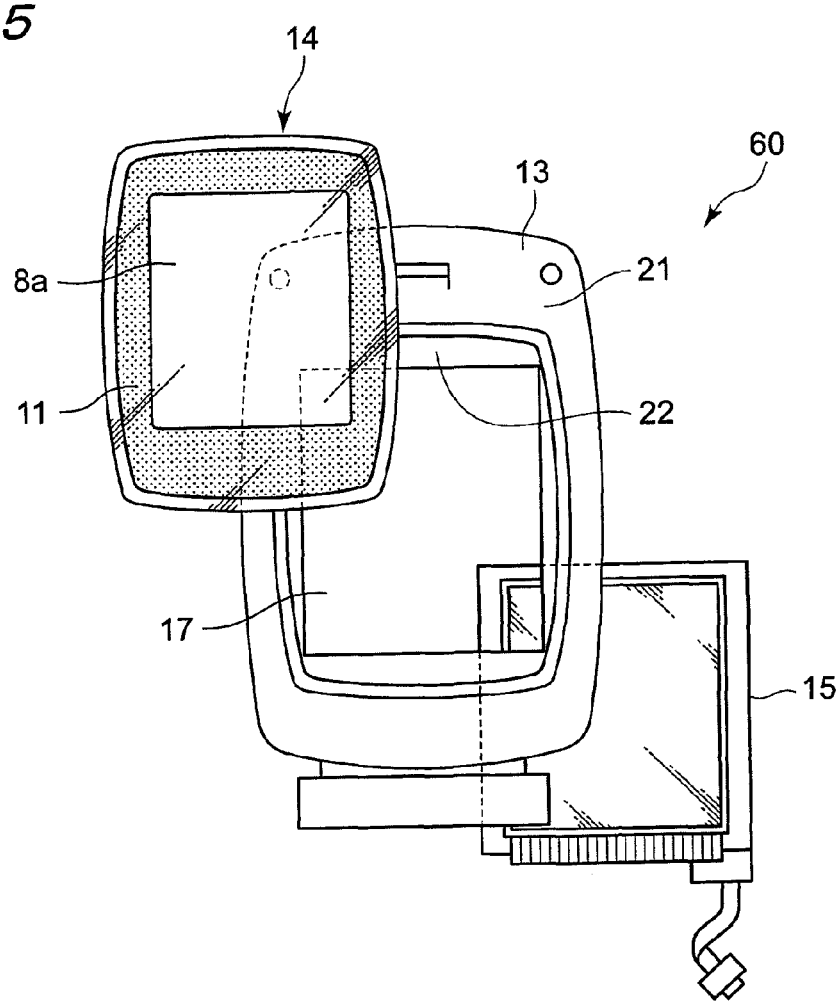
FIG. 5 is an exploded view of an example of a mount structure in a casing using the protection panel for a display window of an electronic device according the first embodiment.
Figure 6:
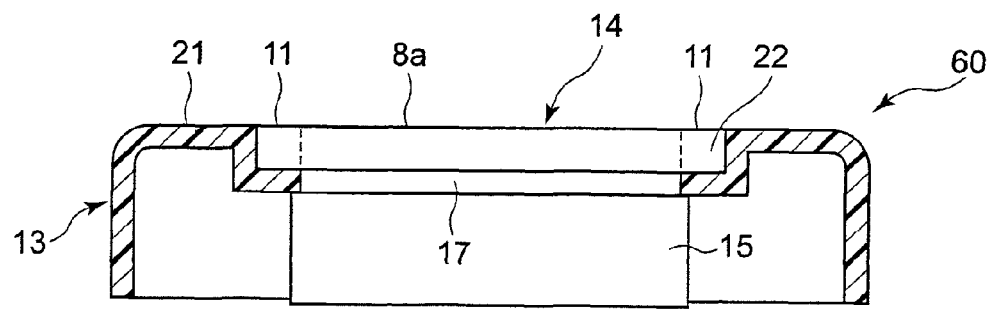
FIG. 6 is a cross sectional view of an example of the mount structure, shown in FIG. 5, in the casing according the first embodiment.
Figure 7:
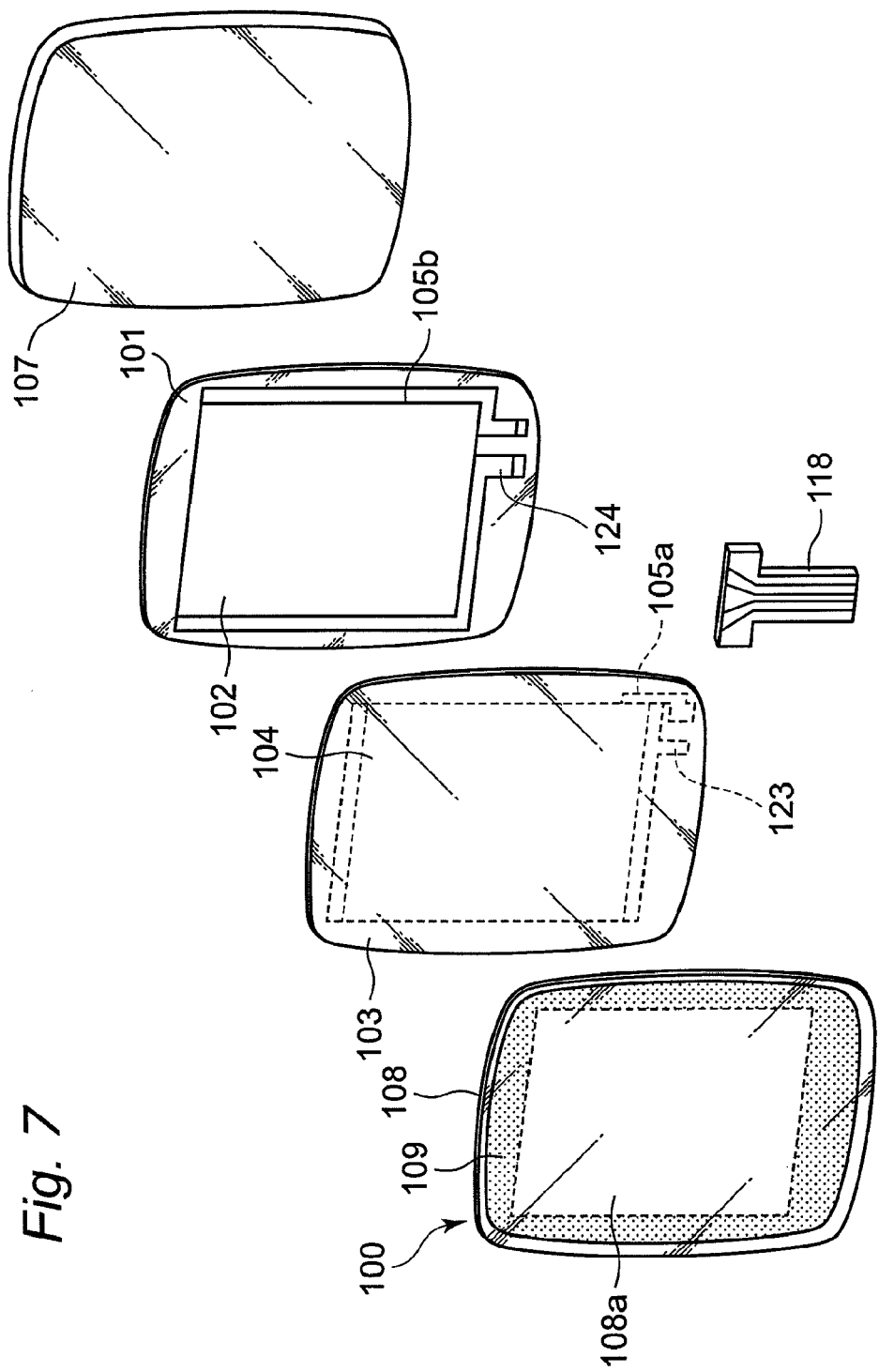
FIG. 7 is an exploded view of a protection panel for a display window of an electronic device according to a conventional art.
Figure 8:
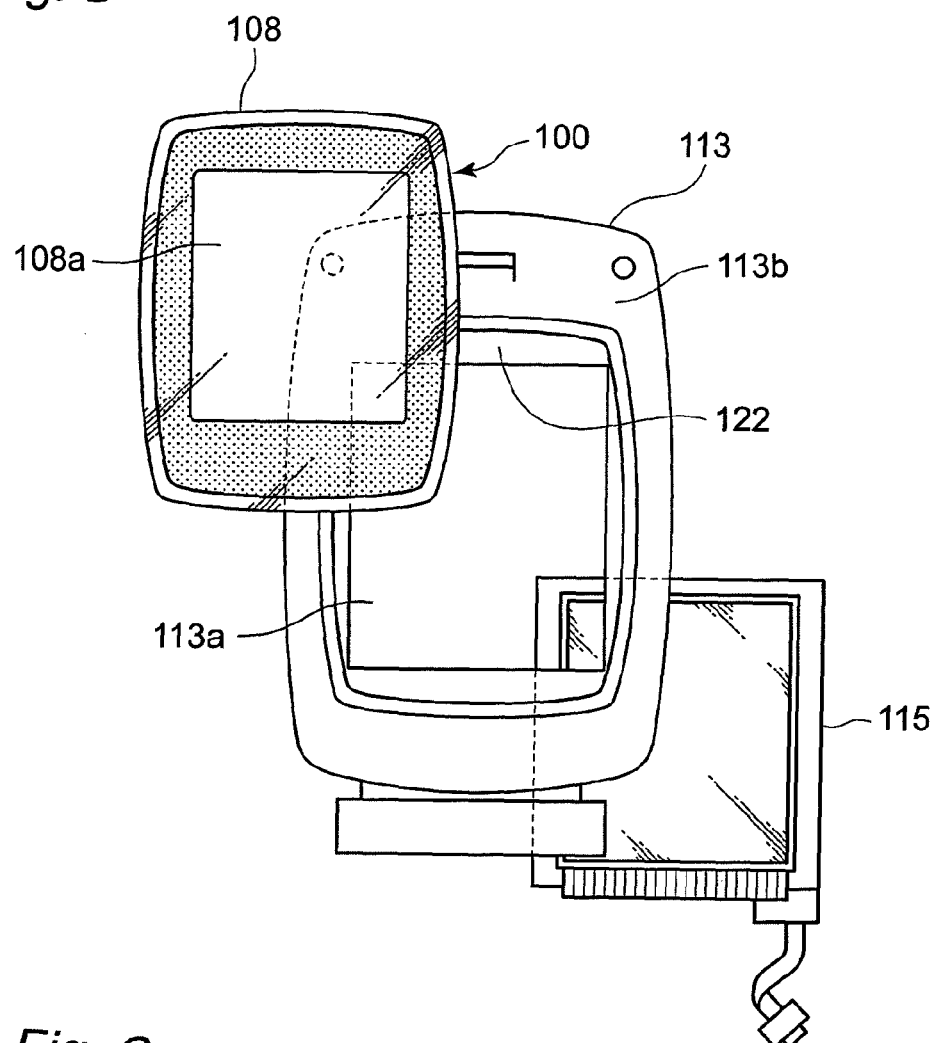
FIG. 8 is an exploded view of an example of a mount structure in a casing using the protection panel for a display window of an electronic device.
Figure 9:
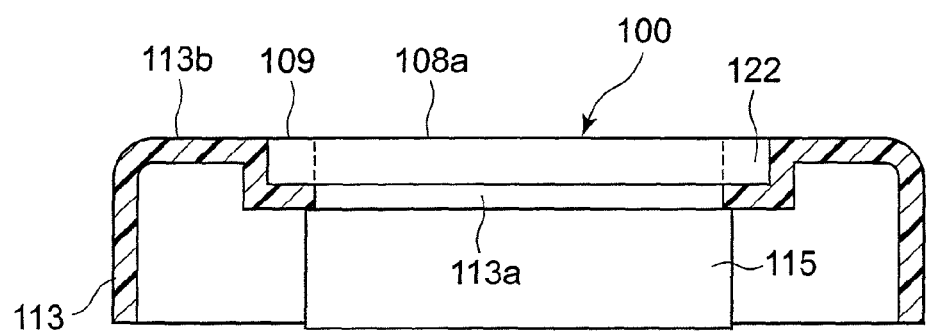
FIG. 9 is a cross sectional view of the example of the mount structure in the casing shown in FIG. 8.
Figure 10:
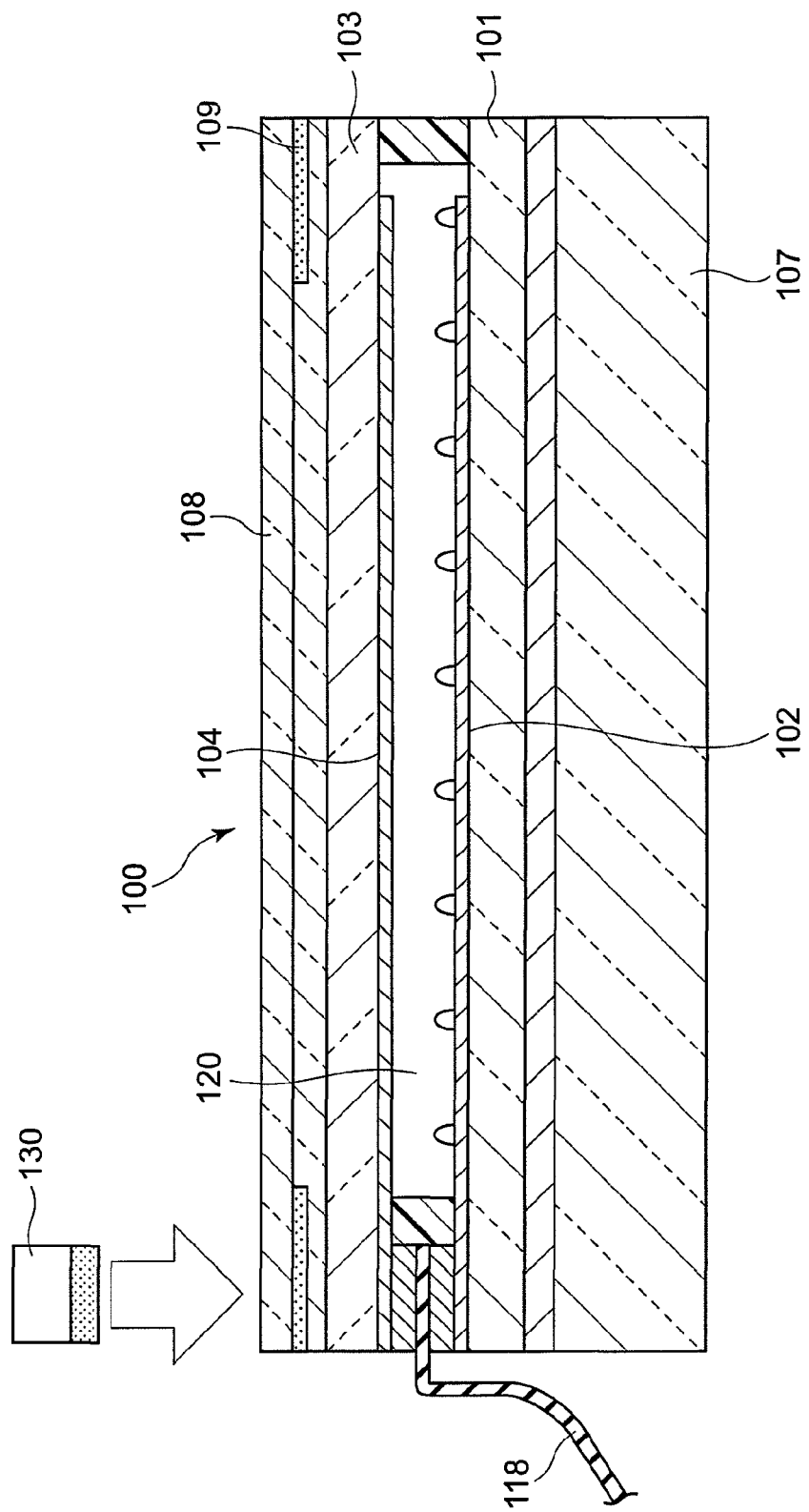
FIG. 10 is a cross sectional view of an example of thermal compression bonding process of an FPC in the protection panel shown in FIG. 7.
Figure 11:
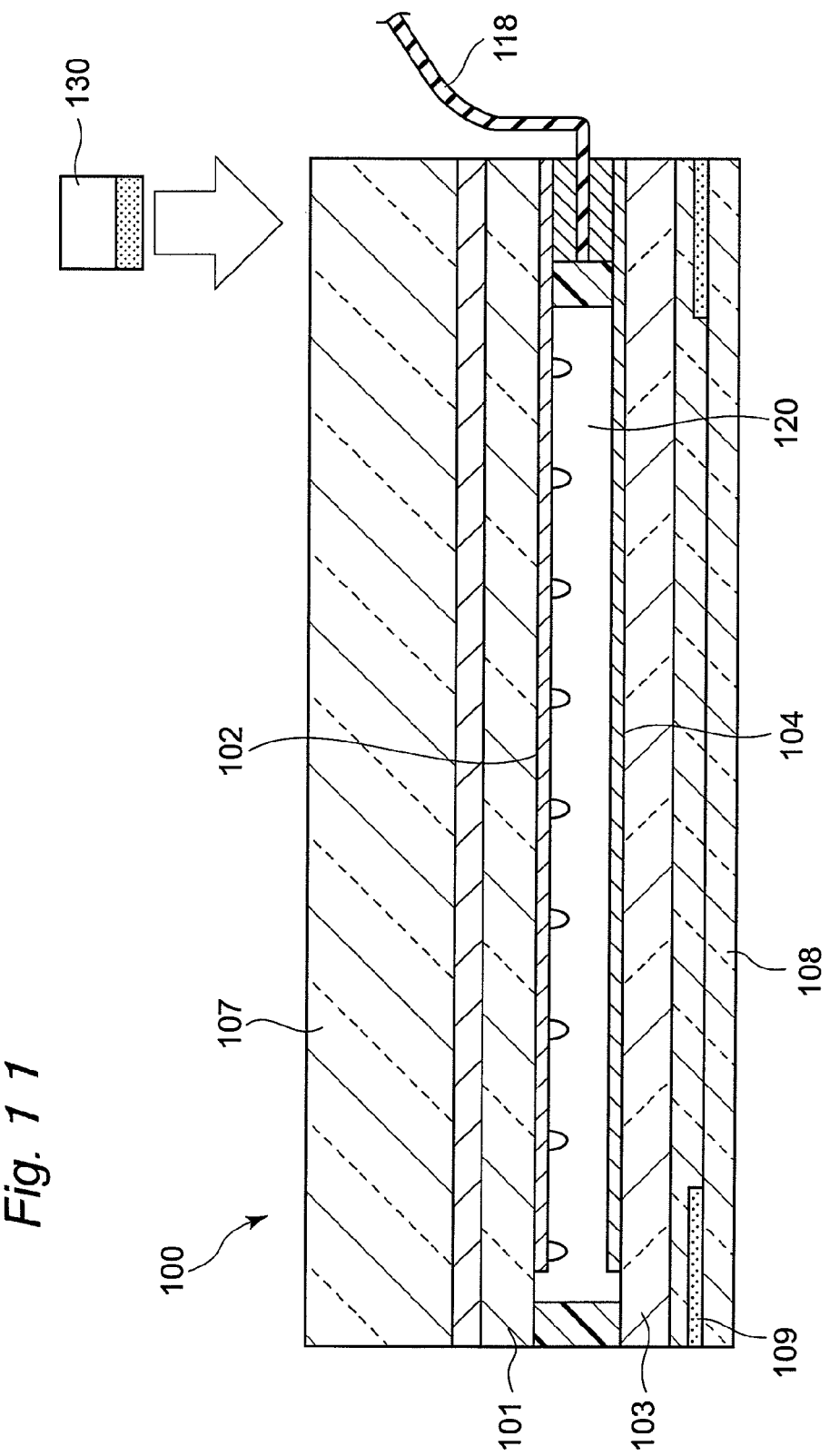
FIG. 11 is a cross sectional view of another example of thermal compression bonding process of the FPC in the protection panel shown in FIG. 7.
Figure 12:
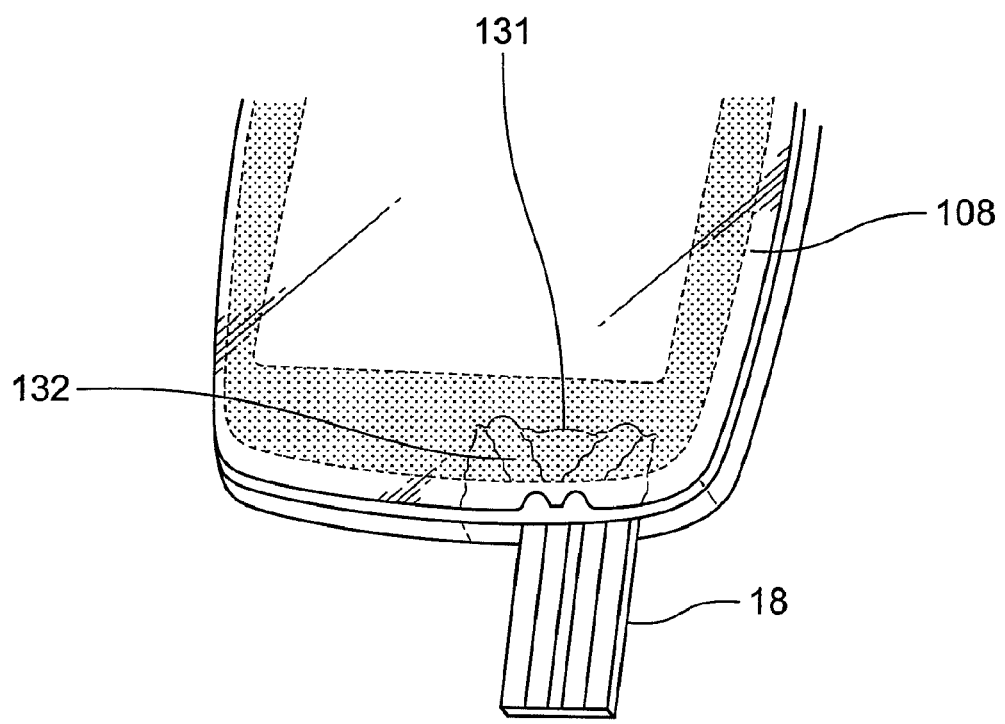
FIG. 12 is a perspective view of a defect generated to the protection panel for a display window of an electronic device according to the conventional art.

FIGS. 1 and 2 show the protection panel 14 for a display window of an electronic device, which is configured to be fitted and retained with no gap into a panel fitting portion 22 of a casing 13 provided with a substantially rectangular opening 17 such that an outer surface of the protection panel 14 forms one plane together with a periphery of the casing 13, as already shown in FIGS. 5 and 6. The protection panel 14 protects a display device 15 that is disposed therebelow so as to be externally visible via a transparent window portion 8a.

The protection panel 14 for a display window of an electronic device includes a protection panel main body configured by a transparent plate, a lower electrode sheet 1 that has a rectangular lower transparent electrode 2 placed on an upper surface of a transparent resin film and a lower circuit 5b provided at the periphery of the lower transparent electrode 2, and is laminated onto an upper surface of the protection panel main body 7, an upper electrode sheet 3 that has a rectangular upper transparent electrode 4 placed on a lower surface of a transparent resin film and an upper circuit 5a provided at the periphery of the upper transparent electrode 4, and is bonded with use of a double-sided adhesive tape 6 or the like to the lower electrode sheet 1 at peripheral edges thereof with a gap 20 being formed between the electrodes 2 and 4, a decorative sheet 8 that has on at least one of surfaces of a transparent resin film a decorative layer 9 forming a transparent window portion 8a while hiding the lower circuit 5b and the upper circuit 5a, and is laminated onto an upper surface of the upper electrode sheet 3, and an FPC 18 that has an end inserted between the lower electrode sheet 1 and the upper electrode sheet 3 and is connected by thermal compression bonding to output ends 23 and 24 of the upper circuit 5a and the lower circuit 5b respectively. When the surface of the decorative sheet 8 is pressed with a finger, a pen, or the like, the upper electrode sheet 3 and the decorative sheet 8 are integrally bent downwards. As a result, the electrodes 2 and 4 respectively provided on the inner surfaces of the lower electrode sheet 1 and the upper electrode sheet 3 are brought into contact with each other, so that an input position is detected.

The transparent plate configuring the protection panel main body 7 is made of a material that is excellent in transparency and is capable of protecting from damages the display device 15 such as a liquid crystal panel or an organic EL panel. Examples of the material for the transparent plate include glass, or general resins such as polystyrene series resin, polyolefin series resin, ABS resin, AS resin, acrylic series resin, or AN resin. Furthermore, the material for the transparent plate may be general engineering resin such as polyphenylene oxide polystyrene series resin, polycarbonate series resin, polyacetal series resin, polycarbonate modified polyphenylene ether resin, polybutylene terephthalate resin, or ultrahigh molecular weight polyethylene resin; or super engineering resin such as polysulfone resin, polyphenylene sulfide series resin, polyphenylene oxide series resin, polyarylate resin, polyetherimide resin, polyimide resin, liquid crystalline polyester resin, or polyallyl series high-temperature resin.

The first embodiment of the present invention is characterized in that the protection panel main body 7 is provided with a cutout portion 33 or a concave portion 33a at a portion corresponding to a portion bonded with the FPC 18 by thermal compression so as to form a thermal compression head inserting space 50. There is thus formed a transmitting portion that allows heat and pressure from a heater 30 (refer to FIG. 3) of a thermal compression head to be efficiently transmitted. The thermal compression head inserting space 50 thus provided can reduce the distance between the surface of the protection panel main body 7 and the surface of the lower electrode sheet 1 at the portion corresponding to the portion bonded with the FPC 18 by thermal compression, relative to the distance therebetween at a portion other than the portion corresponding to the portion bonded with the FPC 18 by thermal compression (the remaining portion). In comparison to the remaining portion (in other words, a case of being provided with no thermal compression head inserting space 50), heat and pressure of the heater 30 (refer to FIG. 3) of the thermal compression head are sufficiently transmitted to a conductive adhesive agent 18a applied to the end of the FPC 18 at the portion provided with the thermal compression head inserting space 50. Therefore, reliability is excellent at a portion connected with the FPC 18. The heater 30 of the thermal compression head may be, as an example, provided on a surface thereof with a metal head that is made of brass or the like and is covered with an elastic material such as silicon rubber.

More specifically described below first is an exemplary case where the cutout portion 33 is provided as the thermal compression head inserting space 50.

Figure 3:
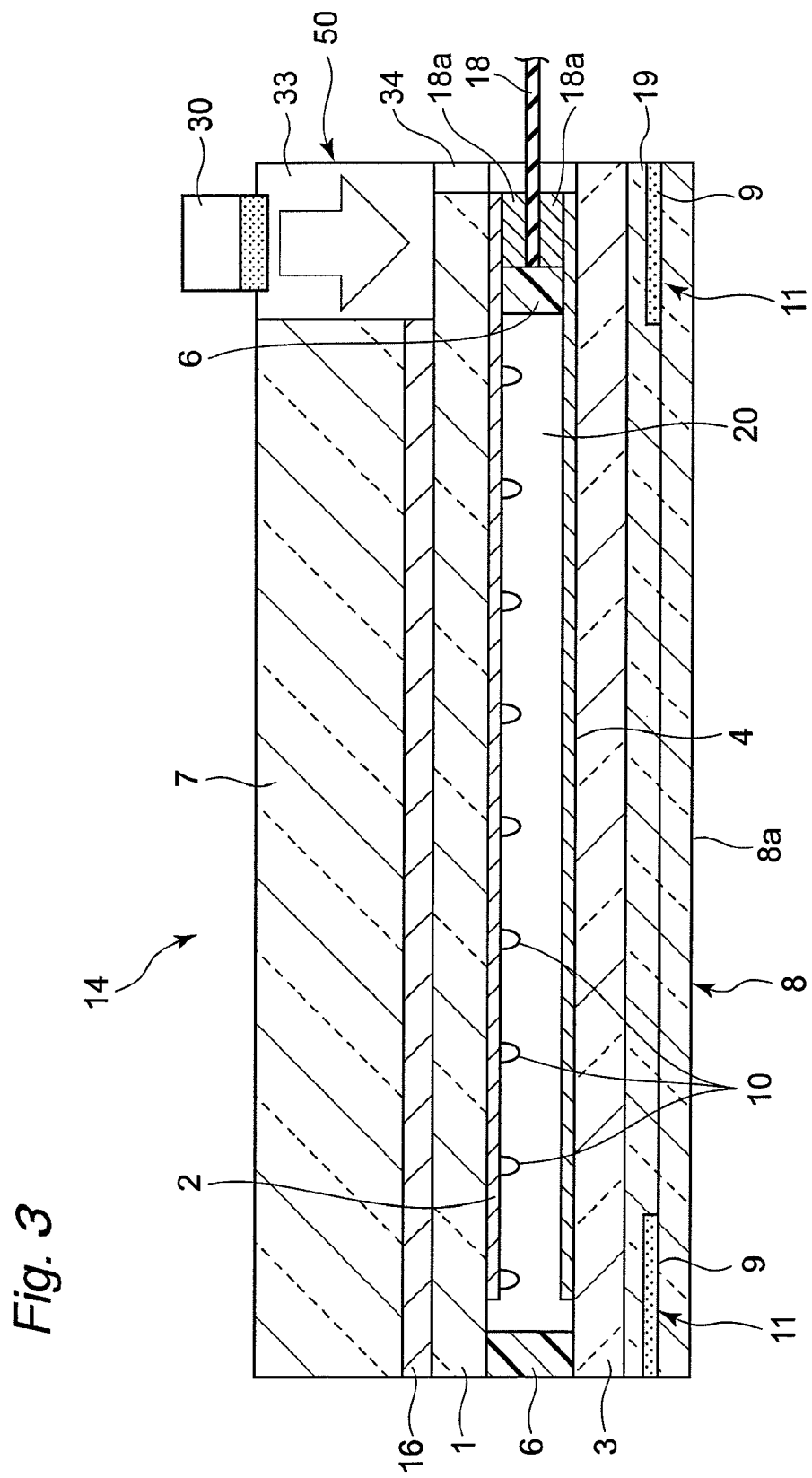
FIG. 3 is a cross sectional view of an example of thermal compression bonding process of an FPC in the protection panel, shown in FIG. 1, according to the first embodiment.

As shown in FIGS. 2 and 3, the cutout portion 33 is formed by removing the protection panel main body 7 and a transparent sticky agent 16 at the portion corresponding to the portion bonded with the FPC 18 by thermal compression. The cutout portion 33 thus provided exposes the lower electrode sheet 1 at the portion corresponding to the portion bonded with the FPC 18 by thermal compression, so that the heater 30 can be pressed directly onto the lower electrode sheet 1 from the protection panel main body-7-side (refer to FIG. 3). As a result, in the protection panel 14 with a touch input function according to the first embodiment of the present invention, heat and pressure are sufficiently transmitted to the conductive adhesive agent 18a that is applied to the end of the FPC 18. Therefore, reliability is excellent at the portion connected with the FPC 18.

Figure 13:
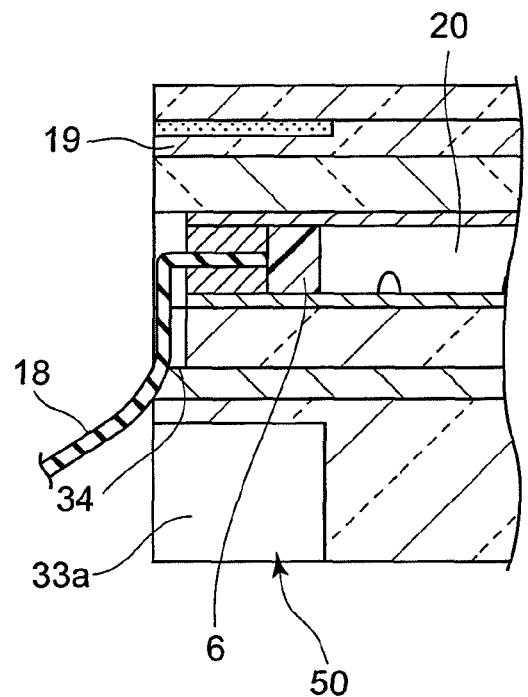
FIG. 13 is a cross sectional view of a protection panel according to a modification of the first embodiment, with a thermal compression head inserting space shown together.
Figure 14:
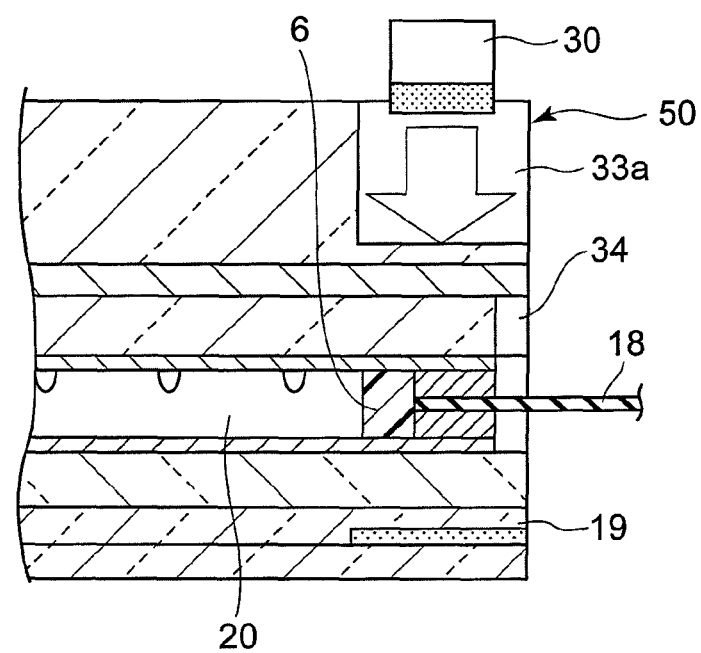
FIG. 14 is a cross sectional view of an example of thermal compression bonding process of the FPC in the protection panel, shown in FIG. 13, according to the modification of the first embodiment.

The thermal compression head inserting space 50 is not limited to the above described cutout portion 33. The cutout portion 33 is provided to remove all the thickness of the protection panel main body 7 at the portion corresponding to the portion bonded with the FPC 18 by thermal compression. Alternatively, there may be provided a portion that removes only partially the thickness thereof. Specifically, as shown in FIGS. 13 and 14, there is formed the concave portion 33a by partially removing the thickness of the protection panel main body 7 at the portion corresponding to the portion bonded with the FPC 18 by thermal compression. The concave portion 33a thus provided dramatically reduces the thickness of the protection panel main body 7 at the portion corresponding to the portion bonded with the FPC 18 by thermal compression, relative to the thickness of the remaining portion. When the heater 30 is pressed to the lower electrode sheet 1 from the protection panel main body-7-side, heat and pressure of the heater 30 can be transmitted much more effectively in comparison to a case where there is provided no concave portion 33a (refer to FIG. 14). As a result, in the protection panel 14 with a touch input function according to the first embodiment of the present invention, heat and pressure are sufficiently transmitted to the conductive adhesive agent 18a that is applied to the end of the FPC 18. Therefore, reliability is excellent at the portion connected with the FPC 18.

Figure 23:
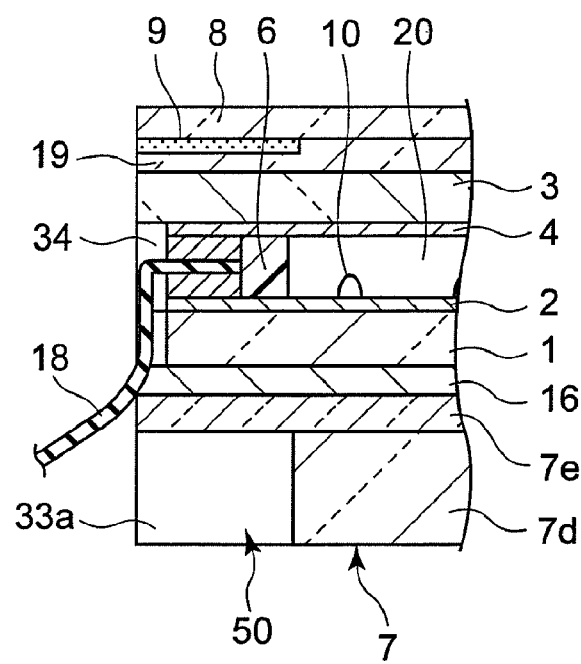
FIG. 23 is a cross sectional view of a protection panel according to still further another modification of the first embodiment.

In order to provide the concave portion 33a at the portion corresponding to the portion bonded with the FPC 18 by thermal compression by partially removing the thickness of the protection panel main body 7, the protection panel main body 7 may be configured by two sheets 7e and 7d that each have thickness different from the other. When the outer sheet 7d is provided with a cutout portion while the inner sheet 7e is not provided with any cutout portion, the inner sheet 7e is disposed at the bottom of the cutout portion in the outer sheet 7d so as to configure the concave portion 33a (refer to FIG. 23). As described above, manufacturing of the concave portion 33a is facilitated by configuring the concave portion 33a with use of the two sheets 7e and 7d, that are, the outer sheet 7d and the inner sheet 7e. It is exemplified that the ratio of the thickness of the outer sheet 7d to the thickness of the inner sheet 7e may be 1 to 1, 6 to 4, 7 to 3, or the like. Alternatively, one of the outer sheet 7d and the inner sheet 7e may be configured by a plurality of sheets.

As already described, the heater 30 is pressed from the protection panel main body-7-side both in the case of providing the cutout portion 33 and in the case of providing the concave portion 33a. Accordingly, any thermal compression taint or unevenness generated by the difference in height of circuits included in the FPC 18 appears on the lower surface of the lower electrode sheet 1. The protection panel 14 with a touch input function according to the first embodiment of the present invention is thus never deteriorated in surface flatness.

In order to keep strength of the protection panel, the cutout portion 33 or the concave portion 33a is preferably formed as small as possible. Nonetheless, the cutout portion 33 is required to be large enough to allow the lower electrode sheet 1 to be exposed at the portion corresponding to the portion bonded with the FPC 18 by thermal compression as well as enough to allow the heater 30, which is moved downwards toward the portion to be bonded with the FPC 18 by thermal compression, to pass therethrough. Similarly, the concave portion 33a is required to be large enough to allow the heater 30 to be brought closer to the lower electrode sheet 1 at the portion corresponding to the portion bonded with the FPC 18 by thermal compression as well as enough to allow the heater 30, which is moved downwards toward the portion to be bonded with the FPC 18 by thermal compression, to pass therethrough. The depth of the concave portion 33a, that is, the remaining thickness of the protection panel main body 7, is preferably not larger than half the thickness of the portion other than the portion to be bonded by thermal compression. The remaining thickness of the protection panel main body 7 is more preferably not more than 40% of the thickness of the portion other than the portion to be bonded by thermal compression. It is noted that, since the portion corresponding to the portion to be bonded with the FPC 18 by thermal compression is allocated so as not to be overlapped with a display portion of the display device 15, provision of the cutout portion 33 or the concave portion 33a never inhibits display on the display device 15.

The transparent resin film configuring the lower electrode sheet 1 or the upper electrode sheet 3 may be a resin film made of engineering plastic of polycarbonate series, polyamide series, polyether ketone series, or the like; a resin film of acrylic series, a resin film of polyethylene terephthalate series, a resin film of polybutylene terephthalate series, or the like.

Figure 4:
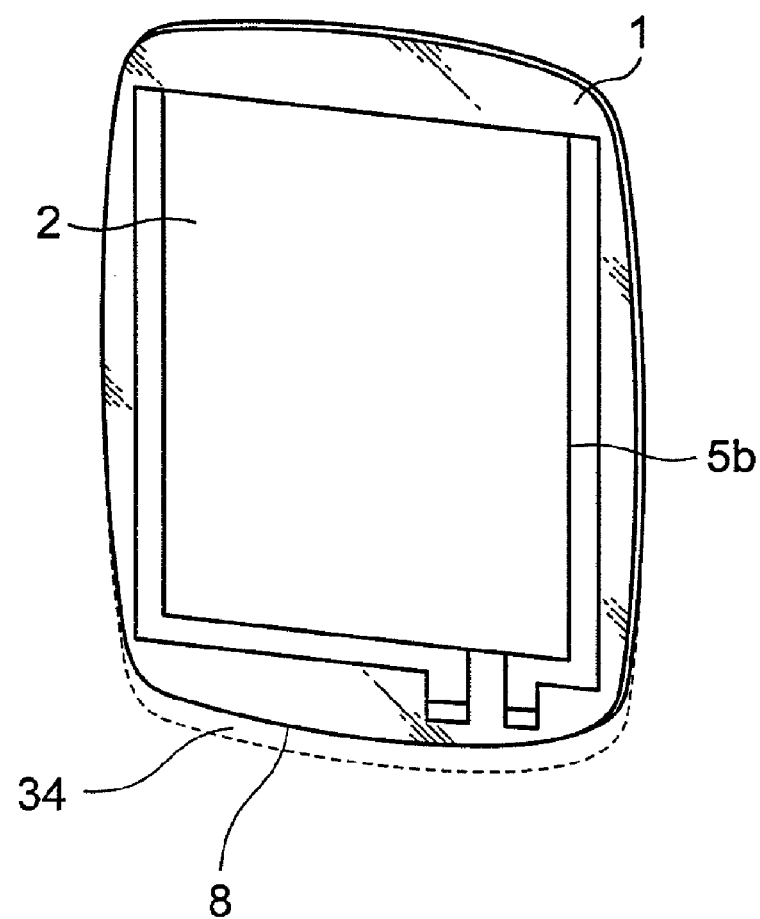
FIG. 4 is a perspective view of a lower electrode sheet used in the protection panel for a display window of an electronic device according to another example of the first embodiment of the present invention.

The lower electrode sheet 1 needs to be provided with a recessed portion 34, as an example of a space for allowing the FPC to turn to be accommodated therein, which is recessed inwards (toward the right in FIG. 2) at a side end surface thereof by not less than 0.05 mm from a side end surface of the protection panel 14, so as to allow the FPC 18 to turn to the rear side thereof (refer to FIG. 2). The recessed portion 34 of the lower electrode sheet 1 provides a gap approximately corresponding to the thickness of the FPC 18 between the inner wall of the panel fitting portion 22 of the casing 13 and the protection panel 14 according to the first embodiment of the present invention. The FPC 18 connected by thermal compression bonding can turn to the rear side of the protection panel 14 by way of the gap. Accordingly, the side end surface not provided with the cutout portion 33 of the protection panel main body 7 can be closely contacted to the inner wall of the panel fitting portion 22 of the casing 13. The recessed portion 34 of the lower electrode sheet 1 may be formed only on a portion of one side as shown in FIG. 1 (a portion of a lower end side in FIG. 1), or may be formed on the whole of the one side as shown in FIG. 4 (the whole of the lower end side in FIG. 4). Formation on the whole of the one side is facilitated in comparison to formation only on a portion of the one side, and also simplified is a punching mold that is used for fabrication thereof.

The lower transparent electrode 2 and the upper transparent electrode 4 are each configured by a transparent conductive film. The transparent conductive film may be made of a thin film of metal oxide such as tin oxide, indium oxide, antimony oxide, zinc oxide, cadmium oxide, or ITO; metal such as gold, silver, copper, tin, nickel, aluminum, or palladium; or conductive polymer. In order to fabricate the lower transparent electrode 2 and the upper transparent electrode 4, there is formed a conductive coating film on an entire surface of a transparent resin film by vacuum vapor deposition, sputtering, ion plating, chemical vapor deposition, roll coating, or the like, and then, unnecessary portions of the conductive coating film is removed by etching. In performing etching, after forming a light-sensitive film by photolithography, screening, or the like, on the portion of the conductive coating film to be left as the electrode, the portion of the conductive coating film provided with no light-sensitive film is removed by being dipped in or spraying an etching solution such as hydrochloric acid, and then the light-sensitive film is removed by being dipped in a solvent so as to be swollen or dissolved. Alternatively, the conductive coating film can be etched with use of laser.

The lower circuit 5b and the upper circuit 5a are each formed by a predetermined pattern such as a bus bar or a routing line. The lower circuit 5b and the upper circuit 5a are each made of metal such as gold, silver, copper, or nickel, or a conductive paste of carbon or the like. These circuits are fabricated by printing such as silk screening, offset lithography, gravure printing, or flexography, by the photoresist technique, by brush coating, or the like. The lower circuit 5b and the upper circuit 5a can be fabricated with no consideration on narrowing the frame as in the touch panel, since the protection panel 14 according to the present first embodiment is disposed integrally with the front casing 13 that has the liquid crystal display window of an electronic device 60 such as a mobile phone and is not restricted by the size of the display device 15.

In order to bond the lower electrode sheet 1 and the upper electrode sheet 3 at the peripheral edges thereof with the gap 20 being formed between the electrodes 2 and 4, used is the double-sided adhesive tape 6 punched out into a frame shape or, in place of the double-sided adhesive tape 6, an insulative transparent adhesive agent made of acrylic resin, epoxy resin, phenolic resin, vinyl resin, or the like. The transparent adhesive agent may be applied by an ordinary printing such as screen printing, offset lithography, gravure printing, or flexography, or the like. It is noted that the lower electrode sheet 1 and the upper electrode sheet 3 are bonded with each other while the region inserted with the FPC 18 is left unbonded, so that the end of the FPC 18 can be inserted thereafter.

There are provided a large number of spacers 10 between the lower electrode sheet 1 and the upper electrode sheet 3 so that the electrodes 2 and 4, which are respectively provided on the facing surfaces thereof, are not accidentally brought into contact with each other. The spacers 10 can be each provided by forming transparent light curing resin into a fine dot shape by the photo process. Alternatively, the spacers 10 can be provided by forming a large number of fine dots by printing.

The transparent resin cover film configuring the decorative sheet 8 may be made of a resin film of engineering plastic of polycarbonate series, polyamide series, polyether ketone series, or the like; a resin film of acrylic series, a resin film of polyethylene terephthalate series, a resin film of polybutylene terephthalate series, or the like.

The decorative sheet 8 is configured by a transparent resin cover film that is provided at least on one of the surfaces thereof with the decorative layer 9 having the transparent window portion 8a, and is laminated on the upper surface of the upper electrode sheet 3. As described above, since the lower electrode sheet 1 and the upper electrode sheet 3 are provided respectively with the opaque circuits 5b and 5a, the decorative layer 9 is provided to cover and hide these circuits. The portion covered with the decorative layer 9 configures a decorative portion 11, while the transparent window portion 8a is configured by the portion not covered with the decorative layer 9. In FIG. 1, as the transparent window portion 8a has a quadrilateral shape, the decorative portion 11 covered with the decorative layer 9 is formed in a frame shape so as to surround the transparent window portion 8a. The decorative sheet 8 covers the recessed portion 34 of the lower electrode sheet 1 so that no gap is visible between the panel fitting portion 22 of the casing 13 provided with the opening 17 and the protection panel 14 fitted thereinto.

The decorative layer 9 is usually formed as a printed layer in the protection panel. The printed layer is formed by a binder made of resin such as polyvinyl chloride series resin, polyamide series resin, polyester series resin, polyacrylic series resin, polyurethane series resin, polyvinyl acetal series resin, polyester urethane series resin, cellulosic ester series resin, alkyd resin, as well as a coloring ink inclusive of pigment or dye in an appropriate color as a coloring agent. The printed layer may be formed by ordinary printing such as offset lithography, gravure printing, screen printing, or the like. In particular, offset lithography or gravure printing is suitable for polychrome printing or gradation expression. Monochrome printing can be realized by coating such as gravure coating, roll coating, or comma coating. The printed layer may be provided on the entire surface or may be partially provided in accordance with a desired decorative pattern.

The decorative layer 9 may be formed by a metal thin film layer or a metal thin film layer combined with a printed layer. The metal thin film layer is adopted for expressing metallic luster as the decorative layer 9, and can be formed by vacuum vapor deposition, sputtering, ion plating, metal plating, or the like. In accordance with the desired color of metallic luster, it is possible to select metal such as aluminum, nickel, gold, platinum, chromium, iron, copper, tin, indium, silver, titanium, lead, or zinc; an alloy thereof; or a compound thereof. Usually, the metal thin film layer is partially formed. The metal thin film layer may be optionally provided together with a pre-anchor layer or a post-anchor layer in order to improve adhesiveness with a different layer.

The decorative layer 9 can be formed on either of the surfaces of the transparent resin cover film. In a case where the decorative layer 9 is formed on the lower surface thereof and is laminated so as to face the upper surface of the upper electrode sheet 3, the decorative layer 9 is not brought into direct contact with a finger or a pen. Therefore, the decorative layer 9 can be prevented from friction.

The decorative sheet 8 may have on its outer surface a hard coating film laminated thereto.

The protection panel main body 7 and the lower electrode sheet 1, as well as the upper electrode sheet 3 and the decorative sheet 8 are bonded with each other by insulative transparent sticky agents 16 and 19, respectively, which are each made of acrylic resin, epoxy resin, phenol resin, vinyl resin, or the like.

It is possible to adopt a well known FPC as the FPC 18. After the protection panel main body 7, the lower electrode sheet 1, the upper electrode sheet 3, and the decorative sheet 8 are laminated all together, the end of the FPC 18 applied with the conductive adhesive agent 18a is inserted between the lower electrode sheet 1 and the upper electrode sheet 3, and the output ends 23 and 24 of the upper circuit 5a and the lower circuit 5b are electrically connected with the connecting end of the FPC 18 with the conductive adhesive agent 18a being interposed therebetween by thermal compression bonding from the protection panel main body-7-side.

The protection panel 14 according to the first embodiment of the present invention is thus configured to have a touch input function on the upper surface of the protection panel main body 7. As shown in FIGS. 5 and 6, the electronic device 60 such as a mobile phone accepts input to the outer surface of the electronic device 60 by fitting the protection panel 14 into the panel fitting portion 22 of the casing 13 provided with the opening 17.

According to the first embodiment, the thickness of the lower electrode sheet 1 is reduced relative to that of the remaining portion since the protection panel main body 7 is provided with the thermal compression head inserting space 33 or 33a at the portion corresponding to the portion bonded with the FPC 18 by thermal compression. The heater 30 can be thus pressed directly or closely to the lower electrode sheet 1 from the protection panel main body side with use of the thermal compression head inserting space 33 or 33a. Accordingly, in the protection panel 14 with a touch input function according to the first embodiment of the present invention, heat and pressure are sufficiently transmitted to the conductive adhesive agent 18a that is applied to the end of the FPC 18, so that reliability is excellent at the portion connected with the FPC.

Furthermore, the heater 30 is pressed from the protection panel main body side in this case, the thermal compression taint or the unevenness generated due to the difference in height of the circuits in the FPC 18 appears on the lower surface of the lower electrode sheet 1. Therefore, the protection panel 14 with a touch input function according to this embodiment of the present invention is not deteriorated in surface flatness.

The FPC 18 is inserted between the lower electrode sheet 1 and the upper electrode sheet 3 to be bonded by thermal compression. Thus, even in the case where the thermal compression head inserting space 50 is provided, the connecting end of the FPC 18 is not exposed to the thermal compression head inserting space 50 and is resistant to poor connection or the like. More specifically, in a case where the connecting end itself of the FPC 18 is exposed to the thermal compression head inserting space 50, the FPC 18 is easy to cause short circuiting and is deteriorated in waterproof property. However, such defects can be prevented in the FPC 18 according to the first embodiment. Further, the FPC 18 is difficult to be detached even in a case where the FPC 18 is pulled to a certain extent, since the FPC 18 is inserted between the lower electrode sheet 1 and the upper electrode sheet 3 and is bonded thereto by thermal compression.

It is noted that the present invention is not limited to this embodiment but can be realized in other various modes.

Figure 15:
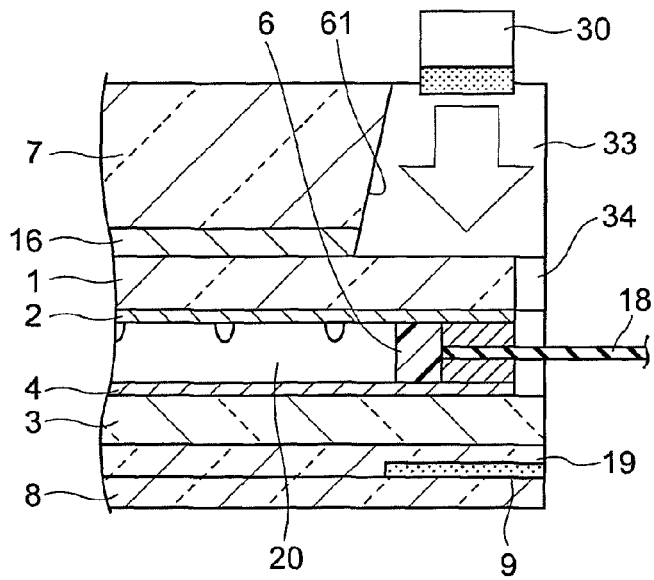
FIG. 15 is a cross sectional view of an example of thermal compression bonding process of an FPC in a protection panel according to another modification of the first embodiment.
Figure 16:
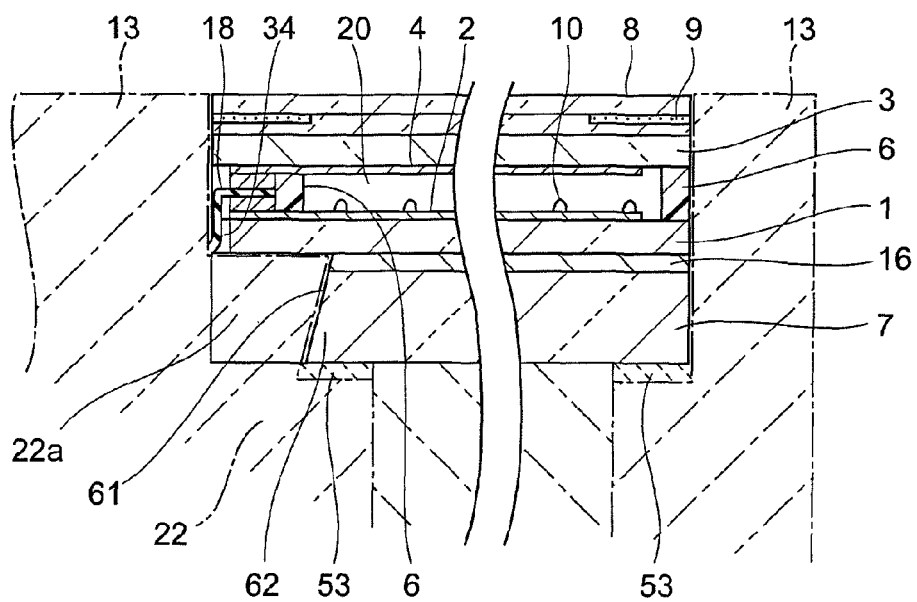
FIG. 16 is a cross sectional view of a state where a protection panel, shown in FIG. 15, according to the other modification of the first embodiment is fitted in a panel fitting portion of a casing.
Figure 17:
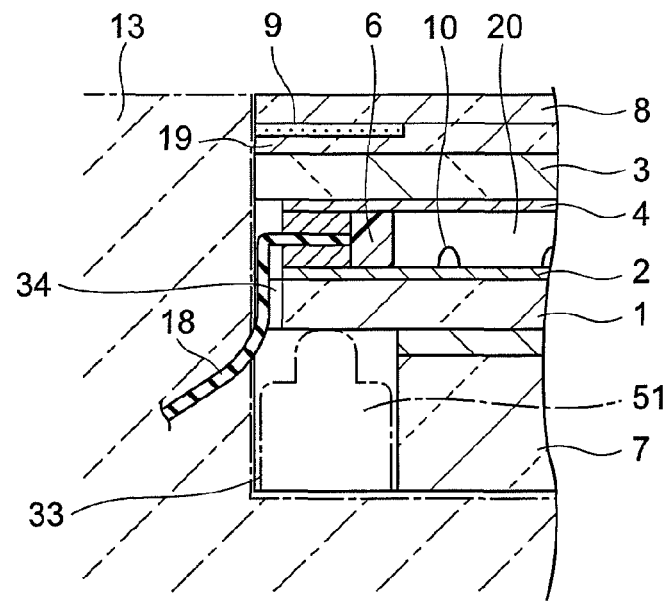
FIG. 17 is a cross sectional view of a state where a protection panel according to still another modification of the first embodiment is fitted in a panel fitting portion of a casing.
Figure 18:
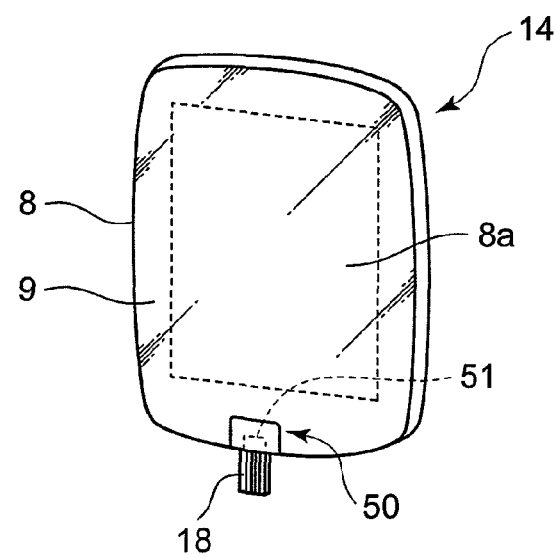
FIG. 18 is a perspective view of the protection panel, shown in FIG. 17, according to the still other modification of the first embodiment.

For example, as shown in FIGS. 2 and 3, the side surface of the cutout portion 33 or the concave portion 33a, which provides the thermal compression head inserting space 50, that is, the side surface of the protection panel main body 7, is not limited to a plane substantially orthogonal to the surface thereof (along the thickness direction), but may be an inclined plane. For example, as shown in FIGS. 15 and 16, the side surface of the protection panel main body 7 may be provided with a casing engaging portion 62 having an inclined surface 61 that is inclined inwards toward the lower electrode sheet 1. In this case, when the protection panel 14 is fitted into the panel fitting portion 22 of the casing 13, an engaging projection 22a provided on the panel fitting portion 22 is inserted into the thermal compression head inserting space 50 provided with the inclined surface 61 to engage the casing engaging portion 62 and the engaging projection 22a with each other. Accordingly, there is provided an anti detach function such that the protection panel 14 fitted into the panel fitting portion 22 is difficult to be detached therefrom. Reference numeral 53 denotes a double-sided tape by which the panel fitting portion 22 and the protection panel 14 are bonded with each other. The casing engaging portion 62 can be also utilized as a positioning projection that facilitates positioning the protection panel 14 to be fitted into the panel fitting portion 22.

Alternatively, when the protection panel 14 is fitted into the panel fitting portion 22 of the casing 13, the protection panel 14 can be disposed by inserting a switch 51 provided to the panel fitting portion 22 into the thermal compression head inserting space 50. In this case, the thermal compression head inserting space 50 can be more effective by using in thermal compression bonding with the FPC 18 as well as by using as the space for disposing the switch 51.

As shown in FIG. 1, the thermal compression head inserting space 50 of the protection panel main body 7 is provided partially on one side of the protection panel main body 7 (in FIG. 1, at the portion on the lower end side displaced a little from the center toward one end). The position of the thermal compression head inserting space 50 is not limited to this case, but may be provided at the center of one side of the protection panel main body 7 as shown in FIG. 19 (in FIG. 1, at the center of the lower end side), or at one end of one side of the protection panel main body 7 as shown in FIG. 20 (in FIG. 1, at the left end of the lower end side).

In the example described above, the thermal compression head inserting space 50 is provided as a single rectangular space. The thermal compression head inserting space 50 is not limited thereto, but may be configured by a plurality of pectinate spaces 50*a* each provided for one terminal or for a plurality of adjacent terminals in connecting the connecting end of the FPC 18 and the output ends 23 and 24 of the upper circuit 5*a* and the lower circuit 5*b* (refer to FIG. 21).

Figure 22:
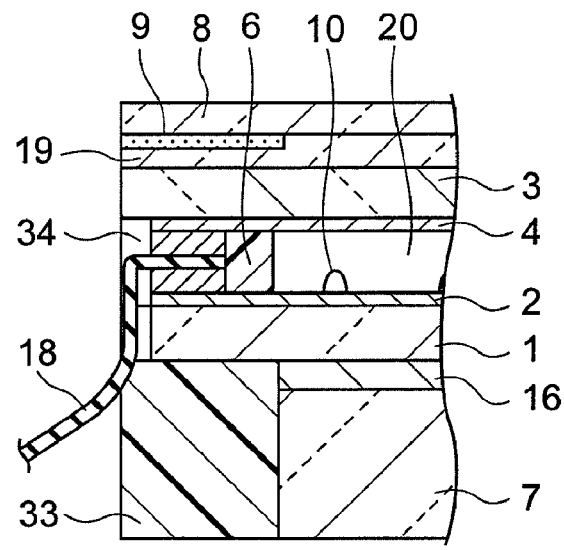
FIG. 22 is a cross sectional view of a protection panel according to still further another modification of the first embodiment.

Further, as shown in FIG. 22, synthetic resin (such as insulative synthetic resin) may be poured into the thermal compression head inserting space 50 after the FPC is bonded by thermal compression so that the thermal compression head inserting space 50 is filled with a resin portion 52. Accordingly, unintended contact between the lower electrode sheet 1 and the upper electrode sheet 3 can be prevented in the thermal compression head inserting space 50.

Described below are more specific working examples of the first embodiment.

WORKING EXAMPLES

First Working Example

There was prepared a polycarbonate plate of 1.0 mm thick, which was provided with a cutout portion of 12 mm wide by 4 mm deep by cutting off a portion corresponding to a portion bonded with the FPC by thermal compression, so that there was obtained a protection panel main body of 75 mm long by 50 mm wide.

There was formed, by sputtering, an ITO film of nm thick on a whole of one of the surfaces of a transparent insulative film made of a polycarbonate (PC) film of 0.1 mm thick. A rectangular lower transparent electrode was obtained by removing by etching the ITO film at an unnecessary portion. Then, formed on the entire upper surface of the lower transparent electrode were spacers each in a fine dot shape by screen-printing with use of thermoset resin of epoxy acrylate series. There were formed as a lower circuit, by screen-printing a silver paste, lower bus bars that are disposed on two sides facing the vertical direction of the lower transparent electrode as well as routing lines that are respectively used for external output respectively from the lower bus bars. Lastly obtained was a lower electrode sheet of 75 mm long by 50 mm wide by cutting off a transparent insulative film partially on a side for pulling out the FPC such that a side end surface thereof is recessed inwards by 0.1 mm so as to allow the FPC to turn to the rear side.

There was prepared a flexible transparent insulative film made of a polyethylene terephthalate (PET) film of 0.125 mm thick, on a whole of one surface of which an ITO film of 20 nm thick was formed by sputtering. After the processed film was cut into a sheet shape of sizes in length and width identical to those of the lower electrode panel, etching was applied to remove the ITO film at an unnecessary portion, thereby forming a rectangular upper transparent electrode. There were formed as an upper circuit, by screen-printing a silver paste, upper bus bars that are disposed on two sides facing the transverse direction of the upper transparent electrode as well as routing lines that are used for external output respectively from the upper bus bars. Thus obtained was an upper electrode sheet of 75 mm long by 50 mm wide.

There was prepared a flexible transparent insulative film made of a PET film of 0.05 mm thick. Formed on one surface of the transparent insulative film by screen-printing was a decorative layer having a transparent window portion of 65 mm long by 40 mm wide, with use of a coloring ink that includes polyester series resin and distributed pigment. Thus obtained was a decorative sheet of 75 mm long by 50 mm wide.

Further prepared was a flexible transparent insulative film made of a PET film of 0.125 mm thick. Applied on one surface of the transparent insulative film by gravure printing was an ultraviolet-curable hard coating material of acrylic series. Thus, there was obtained a hard coating sheet of 75 mm long by 50 mm wide.

Entirely laminated together with use of a transparent sticky agent of 0.025 mm thick, which is made of a pressure sensitive adhesive agent, were the surface provided thereon with the decorative layer of the decorative sheet and the surface of the upper electrode sheet not provided with the upper transparent electrode, as well as the protection panel main body and the surface of the lower electrode sheet not provided with the lower transparent electrode. Further, the upper electrode sheet and the lower electrode sheet were laminated with each other with use of a transparent sticky agent of 0.025 mm thick, which is made of a pressure sensitive adhesive agent, such that the electrodes provided respectively on the upper and lower electrode sheets were spaced apart from each other and such that a region inserted with the end of the FPC was left unlaminated.

Finally, the FPC was placed on a sliding table with the end thereof applied with a conductive adhesive agent being inserted between the lower electrode sheet and the upper electrode sheet. After the sliding table was shifted to a predetermined position, a heater was moved downwards to heat and press to bond the FPC by thermal compression from the protection panel main body side. As the protection panel main body is provided with the cutout portion at the portion corresponding to the portion bonded with the FPC by thermal compression, the lower electrode sheet is exposed at the portion corresponding to the portion bonded with the FPC by thermal compression. Therefore, the heater could be pressed directly to the lower electrode sheet.

Second Working Example

The process was the same as that of the first working example except that the lower electrode sheet made of a transparent insulative film has the side end surface recessed inwards by 0.1 mm on the whole of the side for pulling out FPC.

The protection panels obtained according to the first working example and the second working example were both excellent in surface flatness as well as in reliability at the portion connected with the FPC.

By properly combining the arbitrary embodiments the aforementioned various embodiments, the effects possessed by the embodiments can be produced.

INDUSTRIAL APPLICABILITY

In the protection panel with a touch input function for a display window of an electronic device as well as the electronic device according to the present invention, the protection panel main body is provided with the thermal compression head inserting space at the portion corresponding to the portion bonded with the FPC by thermal compression, and the thickness of the lower electrode sheet is thus reduced relative to that of the other portion. Accordingly, the heater can be pressed directly or closely to the lower electrode sheet from the protection panel main body side with use of the thermal compression head inserting space. Therefore, such a protection panel is useful in a handheld information terminal such as a PDA (Personal Digital Assistant) or a handy terminal, OA (Office Automation) equipment such as a copier or facsimile, a smartphone, a mobile phone, a handheld game machine, an electronic dictionary, a vehicle navigation system, a small PC (Personal Computer), various types of home electric appliances, or the like.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A protection panel with a touch input function for a display window of an electronic device, which is configured to be fitted and retained with no gap in a panel fitting portion of a casing provided with an opening such that an outer surface thereof forms one plane together with a periphery, and which protects a display device disposed therebelow so as to be externally visible via a transparent window portion; the protection panel comprising:
 a protection panel main body configured by a transparent plate;
 a lower electrode sheet that has a rectangular lower transparent electrode on an upper surface of a transparent resin film and a lower circuit provided at a periphery of the lower transparent electrode, and that is laminated onto an upper surface of the protection panel main body;
 an upper electrode sheet that has a rectangular upper transparent electrode on a lower surface of a transparent resin film and an upper circuit provided at a periphery of the upper transparent electrode, and that is bonded to the lower electrode sheet at peripheral edges thereof with a gap being formed between the electrodes;
 a decorative sheet that has a decorative layer defining the transparent window portion at least on one surface of a transparent resin film so as to hide the lower circuit and the upper circuit, and that is laminated onto an upper surface of the upper electrode sheet; and
 an FPC (Flexible Printed Circuit) that has an end inserted between the lower electrode sheet and the upper electrode sheet, and that is connected by thermal compression bonding to output ends of the upper circuit and the lower circuit, wherein
 the protection panel main body has a thermal compression head inserting space at a portion corresponding to a portion bonded with the FPC by thermal compression, the thermal compression head inserting space reducing a distance between a surface of the protection panel main body and a surface of the lower electrode sheet at the portion corresponding to the portion bonded with the FPC by thermal compression, relative to a distance therebetween at a portion other than the portion corresponding to the portion bonded with the FPC by thermal compression, and
 the lower electrode sheet has an end surface recessed inwards to configure a turning FPC accommodating space that allows the FPC to turn to a rear side.

2. The protection panel with a touch input function for a display window of an electronic device according to claim 1, wherein
 the thermal compression head inserting space is provided as a cutout portion that is formed in the protection panel main body.

3. The protection panel with a touch input function for a display window of an electronic device according to claim 1, wherein
 the thermal compression head inserting space is provided as a concave portion that is formed in the protection panel main body.

4. The protection panel with a touch input function for a display window of an electronic device according to claim 1, wherein
 the turning FPC accommodating space of the lower electrode sheet is extended on a whole of a side from which the FPC is pulled out.

5. The protection panel with a touch input function for a display window of an electronic device according to claim 1, wherein
 the thermal compression head inserting space has a resin portion formed by filling synthetic resin therein.

6. The protection panel with a touch input function for a display window of an electronic device according to claim 1, wherein
 the thermal compression head inserting space has a switch disposed therein.

7. The protection panel with a touch input function for a display window of an electronic device according to claim 1, wherein
 the protection panel main body is provided on a side surface configuring the thermal compression head inserting space with a casing engaging portion that has an inclined surface inclined inwards from the surface of the protection panel main body towards the lower electrode sheet.

8. The protection panel with a touch input function for a display window of an electronic device according to claim 1, wherein
 the thermal compression head inserting space is provided as a plurality of pectinate spaces that are formed correspondingly to a plurality of connecting ends of the FPC to be connected to the output ends of the upper circuit and the lower circuit.

9. An electronic device comprising the protection panel with a touch input function for a display window of an electronic device of claim 1, the protection panel being fitted and retained with no gap in the panel fitting portion of the opening in the casing such that the outer surface of the protection panel forms one plane together with the periphery.

* * * * *